United States Patent [19]
Braendle et al.

[11] Patent Number: 6,071,560
[45] Date of Patent: Jun. 6, 2000

[54] TOOL WITH TOOL BODY AND PROTECTIVE LAYER SYSTEM

[75] Inventors: Hans Braendle, Sargans, Switzerland; Nobuhiko Shima, Narita, Japan

[73] Assignee: Balzers Aktiengesellschaft, Fuerstentum, Liechtenstein

[21] Appl. No.: 08/928,652

[22] Filed: Sep. 12, 1997

[51] Int. Cl.$^7$ .................................................. C23C 14/14
[52] U.S. Cl. ........................... 427/249.19; 427/255.394; 427/580; 204/192.38
[58] Field of Search ..................... 427/580, 249, 427/255.2, 249.19, 255.394; 204/197.38

[56] References Cited

U.S. PATENT DOCUMENTS 5,126,030  6/1992  Tamagaki et al. ................. 204/192.38

FOREIGN PATENT DOCUMENTS

| 0 448 720 A1 | 4/1991 | European Pat. Off. . |
| 0 701 982 A1 | 3/1996 | European Pat. Off. . |
| 8-209335 | 8/1996 | Japan . |

OTHER PUBLICATIONS

Average Energy Deposited Per Atom: A Universal Parameter For Describing Ion–Assisted Film Growth; Petrov et al.; Applied Physics Letters, Jul. 5, 1993, pp. 36–38.

Titanium Aluminum Nitride Films: A New Alternative to TiN Coatings; Muenz; Journal Of Vacuum Science & Technology, Nov.–Dec. 1986, pp. 2717–2225.

Interrelationship Between Processing, Coating Properties And Functional Properties of Steered ARC Physically Vapour Deposited (Ti,Al)N And (Ti,Nb)N Coatings; Roos et al.; Elsevier Sequoia; Dec. 1, 1990; pp. 547–556.

Effects Of R.F. Bias And Nitrogen Flow Rates On The Reactive Sputtering Of TiAlN Films; Shew et al.; Elsevier; 1997; pp. 212–219 no month.

Effects of High–Flux Low–Energy (20–100 eV) Ion Irradiation During Deposition On The Microstructure And Preferred Orientation of $Ti_{0.5}Al_{0.5}N$ Alloys Grown By Ultra–High–Vacuum Reactive Magnetron Sputtering; Adibi et al.; Journal of Applied Physics, Jun. 15, 1993; pp. 8580–8589.

The Structure And Composition Of Ti–Zr–N, Ti–Al–Zr–N and Ti–Al–V–N Coatings, Knotek et al.; Materials Science and Engineering, 1988; pp. 481–488 (no month).

*Primary Examiner*—Timothy Meeks
*Attorney, Agent, or Firm*—Evenson, McKeown, Edwards & Lenahan, P.L.L.C.

[57] ABSTRACT

A tool has a tool body and a wear resistant layer system, which layer system has at least one layer of MeX. Me comprises titanium and aluminum and X is nitrogen or carbon. The tool has a tool body of high speed steel (HSS) or of cemented carbide, but it is not a solid carbide end mill and not a solid carbide ball nose mill. In the MeX layer, the quotient $Q_I$ as defined by the ratio of the diffraction intensity I(200) to I(111) assigned respectively to the (200) and (111) plains in the X ray diffraction of the material using θ-2θ method is selected to be $\geq 1$. Further, the I(200) is at least twenty times larger than the intensity average noise value, both measured with a well-defined equipment and setting thereof.

11 Claims, 4 Drawing Sheets

TOOL WITH TOOL BODY AND PROTECTIVE LAYER SYSTEM

BACKGROUND AND SUMMARY OF THE INVENTION

The subject matter of U.S. Pat. No. 5,709,784 is incorporated by reference herein.

The present invention is directed on a tool with a tool body and a wear resistant layer system, wherein the layer system comprises at least one layer of MeX, wherein Me comprises titanium and aluminum, X is at least one of nitrogen and of carbon.

Definition

The term $Q_I$ is defined as the ratio of the diffraction intensities I(200) to I(111), assigned respectively to the (200) and (111) plains in the X ray diffraction of a material using the $\theta$-2$\theta$ method. Thus, there is valid $Q_I$=I(200)/I(111). The intensity values were measured with the following equipment and with the following settings:

Siemens Diffractometer D500

Power:

Operating voltage: 30 kV

Operating current: 25 mA

Aperture Diaphragms:

Diaphragm position I: 1°

Diaphragm position II: 0.1°

Detector Diaphragm: Soller slit

Time constant: 4 s

2$\theta$ angular speed: 0.05°/min

Radiation: Cu-K$\alpha$(0.15406 nm)

When we refer to "measured according to MS" we refer to this equipment and to these settings. Thereby, all quantitative results for $Q_I$ and I throughout this application have been measured by MS.

We understand by "tool body" the uncoated tool.

We understand under "hard material" a material with which tools which are mechanically and thermally highly loaded in operation are coated for wear resistance. Preferred examples of such materials are referred to below as MeX materials.

It is well-known in the tool-protecting art to provide wear resistant layer systems which comprise at least one layer of a hard material, as defined by MeX.

The present invention has the object of significantly improving the lifetime of such tools. This is resolved by selecting for said at least one layer a $Q_I$ value, for which there is valid $$Q_I \geq 1$$

and wherein the tool body is made of high speed steel (HSS) or of cemented carbide, whereby said tool is not a solid carbide end mill or a solid carbide ball nose mill. Further, the value of I(200) is higher by a factor of at least 20 than the intensity noise average level as measured according to MS.

According to the present invention it has been recognised that the $Q_I$ values as specified lead to an astonishingly high improvement of wear resistance, and thus of lifetime of a tool, if such a tool is of the kind as specified.

Up to now, application of a wear resistant layer systems of MeX hard material was done irrespective of interaction between tool body material and the mechanical and thermal load the tool is subjected to in operation. The present invention thus resides on the fact that it has been recognised that an astonishing improvement of wear resistance is realised when selectively combining the specified $Q_I$ value with the specified kind of tools, thereby realising a value of I(200) higher by a factor of at least 20 than the average noise intensity level, both measured with MS.

With respect to inventively coating cemented carbide tool bodies, it has further been recognised that a significant improvement in lifetime is reached if such cemented carbide tools are inserts, drills or gear cutting tools, as e.g. hobs or shaper cutters, whereby the improvement is especially pronounced for such inserts or drills.

The inventively reached improvement is even increased if $Q_I$ is selected to be at least 2, and an even further improvement is realised by selecting $Q_I$ to be at least 5. The largest improvement are reached if $Q_I$ is at least 10. It must be stated that $Q_I$ may increase towards infinite, if the layer material is realised with a unique crystal orientation according to a diffraction intensity I(200) at a vanishing diffraction intensity I(111). Therefore, there is not set any upper limit for $Q_I$ which is only set by practicability.

As is known to the skilled artisan, there exists a correlation between hardness of a layer and stress therein. The higher the stress, the higher the hardness.

Nevertheless, with rising stress, the adhesion to the tool body tends to diminish. For the tool according to the present invention, a high adhesion is rather more important than the highest possible hardness. Therefore, the stress in the MeX layer is advantageously selected rather at the lower end of the stress range given below.

These considerations limit in practice the $Q_I$ value exploitable.

In a preferred embodiment of the inventive tool, the MeX material of the tool is titanium aluminum nitride, titanium aluminum carbonitride or titanium aluminum boron nitride, whereby the two materials first mentioned are today preferred over titanium aluminum boron nitride.

In a further form of realisation of the inventive tool, Me of the layer material MeX may additionally comprise at least one of the elements boron, zirconium, hafnium, yttrium, silicon, tungsten, chromium, whereby, out of this group, it is preferred to use yttrium and/or silicon and/or boron. Such additional element to titanium and aluminum is introduced in the layer material, preferably with a content i, for which there is valid $$0.05 \text{ at. } \% \leq i \leq 60 \text{ at. } \%,$$

taken Me as 100 at %.

A still further improvement in all different embodiments of the at least one MeX layer is reached by introducing an additional layer of titanium nitride between the MeX layer and the tool body with a thickness d, for which there is valid $0.05 \ \mu m \leq d \leq 5 \ \mu m$.

In view of the general object of the present invention, which is to propose the inventive tool to be manufacturable at lowest possible costs and thus most economically, there is further proposed that the tool has only one MeX material layer and the additional layer which is deposited between the MeX layer and the tool body.

Further, the stress $\sigma$ in the MeX is preferably selected to be

1 GPa$\leq \sigma \leq$4 GPa, thereby most preferably within the range 1.5 GPa$\leq \sigma \leq$2.5 GPa.

The content x of titanium in the Me component of the MeX layer is preferably selected to be 70 at %≧x≧40 at %, thereby in a further preferred embodiment within the range 65 at %≧x≧55 at %.

On the other hand, the content y of aluminum in the Me component of the MeX material is preferably selected to be 30 at %≦y≦60 at %, in a further preferred embodiment even to be 35 at %≦y≦45 at %.

In a still further preferred embodiment, both these ranges, i.e. with respect to titanium and with respect to aluminum are fulfilled.

The deposition, especially of the MeX layer, may be done by any known vacuum deposition technique, especially by a reactive PVD coating technique, as e.g. reactive cathodic arc evaporation or reactive sputtering. By appropriately controlling the process parameters, which influence the growth of the coating, the inventively exploited $Q_I$ range is realised.

To achieve excellent and reproducible adhesion of the layers to the tool body a plasma etching technology was used, as a preparatory step, based on an Argon plasma as described in U.S. Pat. No. 5,709,784.

DETAILED DESCRIPTION OF THE INVENTION

EXAMPLES 1

Figure 1:
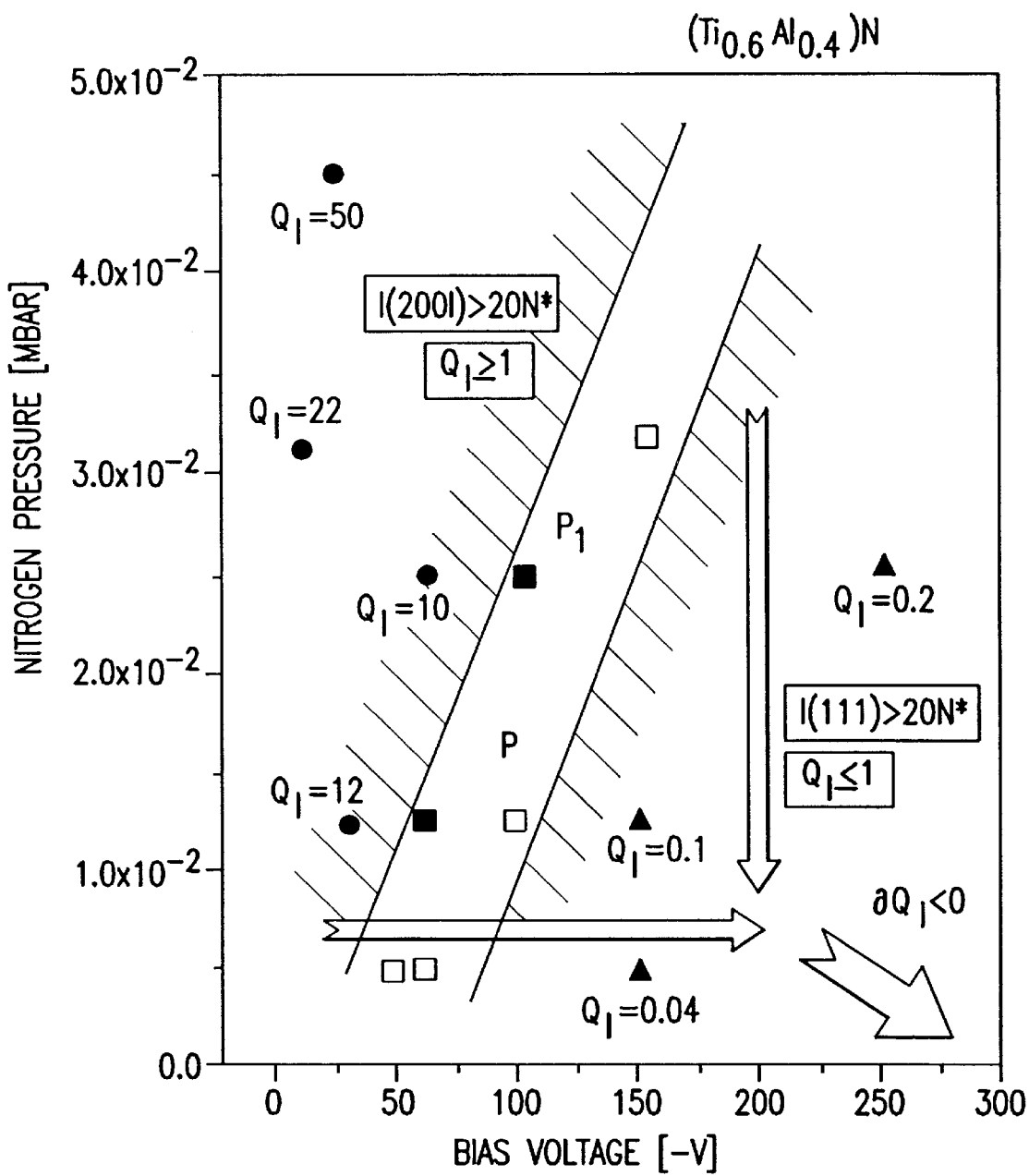
FIG. 1 is a diagram showing the relationship between nitrogen partial pressure and bias voltage of the tool body as applied for reactive cathodic arc eruption in accordance with the present invention.

An arc ion plating apparatus using magnetically controlled arc sources as described in Appendix A was used operated as shown in table 1 to deposit the MeX layer as also stated in table 1 on cemented carbide inserts. The thickness of the MeX layer deposited was always 5 μm. Thereby, in the samples Nr. 1 to 7, the inventively stated $Q_I$ values where realised, whereas, for comparison, in the samples number 8 to 12 this condition was not fulfilled. The I(200) value was always significantly larger than 20 times the noise average value, measured according to MS. The coated inserts were used for milling under the following conditions to find the milling distance attainable up to delamination. The resulting milling distance according to the lifetime of such tools is also shown in table 1.

| Test cutting conditions: | |
|---|---|
| Material being cut: | SKD 61 (HRC45) |
| Cutting speed: | 100 m/min |
| Feed speed: | 0.1 m/edge |
| Depth of cut: | 2 mm |

The shape of the inserts coated and tested was in accordance with SEE 42 TN (G9).

It is clearly recognisable from table 1 that the inserts, coated according to the present inventino, are significantly more protected against delamination than the inserts coated according to the comparison conditions.

Further, the result of sample 7 clearly shows that here the stress and thus hardness of the layer was reduced, leading to lower cutting distance than would be expected for a high $Q_I$ of 22.5, still fulfilling the stress-requirements as defined above.

TABLE 1

| | Sample No. | Coating Conditions | | | | | | $Q_1 =$ I(200)/ I(111) | Residual Stress GPA | Attainable Cutting Distance (m) (distance till delamination) | Remarks |
|---|---|---|---|---|---|---|---|---|---|---|---|
| | | Bias Voltage (−V) | N₂ pressure (mbar) | Arc Current (A) | Layer | x | y | | | | |
| Present Invention | 1 | 60 | 2.0 × 10⁻² | 150 | (Ti$_x$Al$_y$)N | 0.5 | 0.5 | 1.5 | 5.2 | 2.2 m (2.1 m) | |
| | 2 | 60 | 8.0 × 10⁻² | 150 | (Ti$_x$Al$_y$)N | 0.5 | 0.5 | 6.7 | 4.8 | 2.8 m (2.5 m) | |
| | 3 | 40 | 2.0 × 10⁻² | 150 | (Ti$_x$Al$_y$)N | 0.5 | 0.5 | 8.1 | 4.2 | 8.8 m (8.5 m) | face lapping |
| | 4 | 40 | 3.0 × 10⁻² | 150 | (Ti$_x$Al$_y$)N | 0.4 | 0.6 | 10.2 | 3.9 | 3.9 m (3.5 m) | |
| | 5 | 40 | 0.5 × 10⁻² | 150 | (Ti$_x$Al$_y$)N | 0.5 | 0.5 | 6.0 | 5.8 | 2.0 m (1.7 m) | |
| | 6 | 30 | 2.0 × 10⁻² | 150 | (Ti$_x$Al$_y$)N | 0.5 | 0.5 | 15.4 | 2.5 | 4.2 m (4.0 m) | |
| | 7 | 20 | 2.0 × 10⁻² | 150 | (Ti$_x$Al$_y$)N | 0.5 | 0.5 | 22.5 | 1.2 | 3.3 m (3.3 m) | |
| Comparison | 8 | 60 | 0.5 × 10⁻² | 150 | (Ti$_x$Al$_y$)N | 0.5 | 0.5 | 0.8 | 6.1 | 1.0 m (0.8 m) | |
| | 9 | 100 | 2.0 × 10⁻² | 150 | (Ti$_x$Al$_y$)N | 0.5 | 0.5 | 0.7 | 5.5 | 0.9 m (0.9 m) | |
| | 10 | 100 | 3.0 × 10⁻² | 150 | (Ti$_x$Al$_y$)N | 0.5 | 0.5 | 0.9 | 4.8 | 0.8 m (0.7 m) | |
| | 11 | 150 | 2.0 × 10⁻² | 150 | (Ti$_x$Al$_y$)N | 0.5 | 0.5 | 0.2 | 7.2 | 0.1 m (0.1 m) | |
| | 12 | 100 | 0.5 × 10⁻² | 150 | (Ti$_x$Al$_y$)N | 0.4 | 0.6 | 0.1 | 6.8 | 0.2 m (0.1 m) | |

EXAMPLES 2

The apparatus as used for coating according to Example 1 was also used for coating the samples Nr. 13 to 22 of table 2. The thickness of the overall coating was again 5 μm. It may be seen that in addition to the coating according to Example 1 there was applied an interlayer of titanium nitride between the MeX layer and the tool body and an outermost layer of the respective material as stated in table 2. The condition with respect to I(200) and average noise level, measured according to MS was largely fulfilled.

It may be noted that provision of the interlayer between the MeX layer and the tool body already resulted in a further improvement. An additional improvement was realised by providing an outermost layer of one of the materials titanium carbonitride, titanium aluminum oxinitride and especially with an outermost layer of aluminum oxide. Again, it may be seen that by realising the inventively stated $Q_I$ values with respect to the comparison samples number 19 to 22, a significant improvement is realised.

The outermost layer of aluminum oxide of 0.5 µm thickness, was formed by plasma CVD.

The coated inserts of cemented carbide were tested under the same cutting conditions as those of Example 1, $Q_I$ was measured according to MS.

in table 3. For comparison, inserts coated inventively with different Me compounds of the MeX material were equally tested. It becomes evident that by adding any of the elements according to samples 23 to 32 to Me, the thickness of the resulting oxide film is significantly reduced. With respect to oxidation the best results were realised by adding silicon or yttrium.

It must be pointed out, that it is known to the skilled artisan, that for the MeX material wear resistant layers there is valid: The better the oxidation resistance and thus the thinner the resulting oxide film, the better the cutting performance.

TABLE 2

| Sample No. | | Inter-layer (µm) | TiAl Layer | x | y | Outermost Layer | $Q_1 =$ $I(200)/$ $I(111)$ | Attainable Cutting Distance (m) (distance till delamination) |
|---|---|---|---|---|---|---|---|---|
| Present Invention | 13 | TiN (0.4 µm) | $(Ti_xAl_y)N$ (4.6 µm) | 0.5 | 0.5 | — | 1.5 | 4.5 m (4.2) |
| | 14 | TiN (0.4 µm) | $(Ti_xAl_y)N$ (4.1 µm) | 0.5 | 0.5 | TiCN (0.5 µm) | 7.2 | 7.8 (7.6 m) |
| | 15 | TiN (0.4 µm) | $(Ti_xAl_y)N$ (4.4 µm) | 0.5 | 0.5 | TiCN (0.5 µm) | 6.8 | 6.0 m (5.5 m) |
| | 16 | TiCN (0.4 µm) | $(Ti_xAl_y)N$ (4.1 µm) | 0.5 | 0.5 | (TiAl)NO (0.5 µm) | 5.2 | 6.2 m (6.0 m) |
| | 17 | TiN (0.4 µm) | $(Ti_xAl_y)N$ (4.1 µm) | 0.5 | 0.5 | $Al_2O_3$ (0.5 µm) | 12.5 | 10.1 m (9.8 m) |
| | 18 | TiN (0.4 µm) | $(Ti_xAl_y)N$ (4.1 µm) | 0.5 | 0.5 | $Al_2O_3$ (0.5 µm) | 7.0 | 9.8 m (9.5 m) |
| Comparison | 19 | TiN | $(Ti_xAl_y)N$ | 0.5 | 0.5 | — | 0.8 | 1.5 m (1.2 m) |
| | 20 | TiN | $(Ti_xAl_y)N$ | 0.5 | 0.5 | TiCN | 0.8 | 1.9 m (1.5 m) |
| | 21 | TiN | $(Ti_xAl_y)N$ | 0.5 | 0.5 | TiCN | 0.7 | 1.8 m (1.5 m) |
| | 22 | TiN | $(Ti_xAl_y)N$ | 0.5 | 0.5 | (TiAl)NO | 0.1 | 0.6 m (0.4 m) |

EXAMPLE 3

Again, cemented carbide inserts were coated with the apparatus of Example 1 with the MeX layer as stated in table 3, still fulfilling the $Q_I$ conditions as inventively stated and, by far, the condition of I(200) with respect to average noise level, measured according to MS. Thereby, there was introduced one of zirconium, hafnium, yttrium, silicon and chromium, with the amount as stated above, into Me.

The coated inserts were kept in an air oven at 750° C. for 30 min. for oxidation. Thereafter, the resulting thickness of the oxide layer was measured. These results are also shown

TABLE 3

| | Sample No. | Layer Composition | w | x | y | z | Thickness of Oxide Film (µm) |
|---|---|---|---|---|---|---|---|
| Present Invention | 23 | $(Ti_xAl_yY_z)N$ | | 0.48 | 0.5 | 0.02 | 0.7 |
| | 24 | $(Ti_xAl_yCr_z)N$ | | 0.48 | 0.5 | 0.02 | 0.9 |
| | 25 | $(Ti_xAl_yZr_z)N$ | | 0.48 | 0.5 | 0.02 | 0.7 |
| | 26 | $(Ti_xAl_yY_z)N$ | | 0.25 | 0.5 | 0.25 | 0.1 |
| | 27 | $(Ti_xAl_yZr_z)N$ | | 0.25 | 0.5 | 0.25 | 0.5 |
| | 28 | $(Ti_zAl_yW_z)N$ | | 0.4 | 0.5 | 0.1 | 0.8 |
| | 29 | $(Ti_xAl_ySi_z)N$ | | 0.4 | 0.5 | 0.1 | 0.1 |
| | 30 | $(Ti_xAl_ySi_z)N$ | | 0.48 | 0.5 | 0.02 | 0.2 |
| | 31 | $(Ti_xAl_yHf_z)N$ | | 0.4 | 0.5 | 0.1 | 0.9 |
| | 32 | $(Ti_xAl_yY_zSi_w)N$ | 0.1 | 0.3 | 0.5 | 0.1 | 0.05 |
| Comparison | 33 | $(Ti_xAl_y)N$ | | 0.4 | 0.6 | | 1.8 |
| | 34 | $(Ti_xAl_yNb_z)N$ | | 0.4 | 0.5 | 0.1 | 2.5 |
| | 35 | $(Ti_xAl_yTa_z)N$ | | 0.4 | 0.5 | 0.1 | 3.3 |

EXAMPLE 4

An apparatus and a coating method as used for the samples of Example 1 was again used.

HSS drills with a diameter of 6 mm were coated with a 4.5 µm MeX and a TiN interlayer was provided between the MeX layer and the tool body, with a thickness of 0.1 µm. The test condition were.

Tool: HSS twist drill, dia. 6 mm
Material: DIN 1.2080 (AISI D3)
Cutting parameters:
$v_c$=35 m/min f=0.12 mm/rev.

15 mm deep blind holes with coolant.

TABLE 4

| | | Bias Voltage (−V) | N$_2$-Pressure (mbar) | Arc current (A) | inter-layer | layer | x | y | z | Q$_1$ | Residual Stress (GPa) | Number of drilled holes |
|---|---|---|---|---|---|---|---|---|---|---|---|---|
| Present Invention | 36 | 40 | 3.0 × 10$^{-2}$ | 200 | TiN 0.1 μm | (Ti$_x$Al$_y$)N | 0.6 | 0.4 | | 5.4 | 2.1 | 230 |
| | 37 | 40 | 3.0 × 10$^{-2}$ | 200 | TiN 0.1 μm | (Ti$_x$Al$_y$B$_z$)N | 0.58 | 0.4 | 0.02 | 3.8 | 2.3 | 190 |
| Comparsion | 38 | 150 | 1.0 × 10$^{-2}$ | 200 | TiN 0.1 μm | (Ti$_x$Al$_y$)N | 0.6 | 0.4 | | 0.03 | 4.5 | 10 |
| | 39 | 150 | 1.0 × 10$^{-2}$ | 200 | TiN 0.1 μm | (Ti$_x$Al$_y$B$_z$)N | 0.58 | 0.4 | 0.02 | 0.1 | 4.8 | 38 |

The lifetime of the tool was determined by the number of holes which could be drilled before failure of the drill.

The results of the inventively coated drills are shown as samples No. 36 and 37 in Table 4, the samples No. 38 and 39 again show comparison samples. Again, I(200) exceeded 20 times intensity average noise level by far, for samples 36, 37, as measured by MS.

EXAMPLE 5

Again, the apparatus and method as mentioned for Example 1 was used for coating HSS roughing mills with a diameter of 12 mm with a 4.5 μm MeX layer. There was provided a titanium nitride interlayer with a thickness of 0.1 μm between the MeX layer and the tool body. The test conditions were:

| Tool: | HSS roughing mill, dia. 12 mm |
| | z = 4 |
| Material: | AISI H13 (DIN 1.2344) |
| | 640 N/mm$^2$ |
| Cutting parameters: | v$_c$ = 47.8 m/min |
| | f$_t$ = 0.07 mm |
| | a$_p$ = 18 mm |
| | a$_a$ = 6 mm |
| | climb milling, dry. |

The HSS roughing mill was used until an average width of flank wear of 0.2 mm was obtained.

Sample No. 40 in Table No. 5 shows the results of the inventively coated tool, sample 41 is again for comparison. Again, I(200) of sample Nr. 40 fulfilled the condition with respect to noise, as measured by MS.

EXAMPLE 6

Again, the apparatus and coating method according to Example 1 was used. Solid carbide end mills with a diameter of 10 mm with 6 teeth were coated with a 3.0 μm MeX layer. There was provided a titanium nitride interlayer with a thickness of 0.08 μm between the MeX and the tool body. Test conditions for the end mills were:

| Tool: | Solid carbide end mill, dia. 10 mm |
| | z = 6 |
| Material: | AISI D2 (DIN 1.2379) |
| | 60 HRC |
| Cutting parameters: | v$_c$ = 20 m/min |
| | f$_t$ = 0.031 mm |
| | a$_p$ = 15 mm |
| | a$_c$ = 1 mm |
| | Climb milling, dry |

The solid carbide end mills were used until an average width of flank wear of 0.20 mm was obtained. It is to be noted that solid carbide end mills do no belong to that group of tool which is inventively coated with a hard material layer having Q$_f$≧1. From the result in Table 6 it may clearly be seen that for this kind of tools Q$_f$>1 does not lead to an improvement. Again, the I(200) to noise condition, measured with MS, was fulfilled for sample No. 42, for sample No. 43 the I(111) to noise condition was fulfilled.

TABLE 5

| | | Bias Volatge (−V) | N$_2$-Pressure (mbar) | Arc current (A) | inter-layer | layer | x | y | Q$_1$ | Residual Stress (GPa) | Cutting distance (m) |
|---|---|---|---|---|---|---|---|---|---|---|---|
| Present Invention | 40 | 40 | 3.0 × 10$^{-2}$ | 200 | TiN 0.1 μm | (Ti$_x$Al$_y$)N | 0.6 | 0.4 | 5.4 | 2.1 | 35 m |
| Comparison | 41 | 150 | 1.0 × 10$^{-2}$ | 200 | TiN 0.1 μm | (Ti$_x$Al$_y$)N | 0.6 | 0.4 | 0.03 | 4.5 | 11 m (chipping and peeling off) |

TABLE 6

| | Bias Volatge (-V) | N$_2$-Pressure (mbar) | Arc current (A) | inter-layer | layer | x | y | Q$_1$ | Residual Stress (GPa) | Cutting distance (m) |
|---|---|---|---|---|---|---|---|---|---|---|
| Present Invention | 42 | 40 | 3.0 × 10$^{-2}$ | 200 | TiN 0.08 μm | (Ti$_x$Al$_y$)N | 0.6 | 0.4 | 5.0 | 2.2 | 17 m |
| Comparison | 43 | 150 | 1.0 × 10$^{-2}$ | 200 | TiN 0.08 μm | (Ti$_x$Al$_y$)N | 0.6 | 0.4 | 0.05 | 4.7 | 32 m |

EXAMPLE 7

Again, an apparatus and method as used for the samples of Example 1 were used.

Solid carbide drills with a diameter of 11.8 mm were coated with a 4.5 μm MeX layer. There was provided a TiN interlayer between the MeX layer and the tool body.

| Test conditions: | |
|---|---|
| Tool: | Solid carbide drill, diam. 11.8 mm |
| Workpiece: | Cast iron GG25 |
| Machining conditions: | v$_c$ = 110 m/min |
| | f = 0.4 mm/rev. |
| | Blind hole 3 × diam. |
| | No coolant |

The solid carbide drills were used until a maximum width of flank wear of 0.8 mm was obtained. The I(200) to noise condition was again fulfilled, measured with MS.

TABLE 7

| | Bias Volatge (-V) | N$_2$-Pressure (mbar) | Arc current (A) | inter-layer | layer | x | y | Q$_1$ | Residual Stress (GPa) | Drilling distance (m) |
|---|---|---|---|---|---|---|---|---|---|---|
| Present Invention | 44 | 40 | 3.0 × 10$^{-2}$ | 200 | TiN 0.1 μm | (Ti$_x$Al$_y$)N | 0.6 | 0.4 | 5.4 | 2.1 | 95 m |
| Comparison | 45 | 150 | 1.0 × 10$^{-2}$ | 200 | TiN 0.1 μm | (Ti$_x$Al$_y$)N | 0.6 | 0.4 | 0.03 | 4.5 | 48.5 m |

EXAMPLE 8

Again, the apparatus and method as stated in Example 1 were used. Cemented carbide inserts for turning with a shape in accordance with CNGP432 were coated with a 4.8 μm MeX layer. There was provided a TiN interlayer with a thickness of 0.12 μm between the MeX layer and the tool body. The test conditions were:

| Tool: | Carbide insert (CNGP432) |
|---|---|
| Material: | DIN 1.4306 (X2CrNi 1911) |
| Cutting parameters: | v$_c$ = 244 m/min |
| | f = 0.22 mm/rev. |
| | a$_p$ = 1.5 mm |
| | with emulsion |

The tool life was evaluated in minutes. The indicated value is an average of three measurements. Again, I(200)/noise condition, measured with MS, was fulfilled.

TABLE 8

| | Bias Volatge (-V) | N$_2$-Pressure (mbar) | Arc current (A) | inter-layer | layer | x | y | Q$_1$ | Residual Stress (GPa) | Tool life (min) |
|---|---|---|---|---|---|---|---|---|---|---|
| Present Invention | 46 | 40 | 3.0 × 10$^{-2}$ | 200 | TiN 0.12 μm | (Ti$_x$Al$_y$)N | 0.6 | 0.4 | 5.8 | 1.9 | 18.1 m |
| Comparison | 47 | 150 | 1.0 × 10$^{-2}$ | 200 | TiN 0.12 μm | (Ti$_x$Al$_y$)N | 0.6 | 0.4 | 0.04 | 4.9 | 5.5 min |

In FIG. 1 there is shown, with linear scaling a diagram of nitrogen partial pressure versus bias voltage of the tool body as applied for reactive cathodic arc evaporation as the reactive PVD deposition method used to realise the Examples which were discussed above.

All the process parameters of the cathodic arc evaporation process, namely arc current;

process temperature;

deposition rate;

evaporated material;

strength and configuration of magnetic field adjacent the arc source;

geometry and dimensions of the process chamber and of the workpiece tool to be treated were kept constant. The remaining process parameters, namely partial pressure of the reactive gas—or total pressure—and bias voltage of the tool body to be coated as a workpiece and with respect to a predetermined electrical reference potential, as to the ground potential of the chamber wall, were varied.

Thereby, titanium aluminum nitride was deposited. With respect to reactive gas partial pressure and bias voltage of the tool body, different working points were established and the resulting $Q_I$ values at the deposited hard material layers were measured according to MS.

It turned out that there exists in the diagram according to FIG. 1 and area P, which extends in a first approximation linearly from at least adjacent the origin of the diagram coordinates, wherein the resulting layer lead to very low XRD intensity values of I(200) and I(111). It is clear that for exactly determining the limits of P, a high number of measurements will have to be done. Therein, none of the I(200) and I(111) intensity values is as large as 20 times the average noise level, measured according to MS.

On one side of this area P and as shown in FIG. 1 $Q_I$ is larger than 1, in the other area with respect to P, $Q_I$ is lower than 1. In both these areas at least one of the values I(200), I(111) is larger than 20 times the average noise level, measured according to MS.

As shown with the arrows in FIG. 1, diminishing of the partial pressure of the reactive gas—or of the total pressure if it is practically equal to the said partial pressure—and/or increasing of the bias voltage of the tool body being coated, leads to reduction of $Q_I$. Thus, the inventive method for producing a tool which comprises a tool body and a wear resistant layer system, which latter comprises at least one hard material layer, comprises the steps of reactive PVD depositing the at least one hard material layer in a vacuum chamber, thereby preselecting process parameter values for the PVD deposition process step beside of either or both of the two process parameters, namely of partial pressure of the reactive gas and of bias voltage of the tool body. It is one of these two parameters or both which are then adjusted for realising the desired $Q_I$ values, thus, and according to the present invention, bias voltage is reduced and/or partial reactive gas pressure is increased to get $Q_I$ values, which are, as explained above, at least larger than 1, preferably at least larger than 2 or even 5 and even better of 10. Beside the inventively exploited $Q_I$ value, in this "left hand" area, with respect to P, I(200) is larger, mostly much larger than 20 times the average noise level of intensity, measured according to MS.

Figure 2:
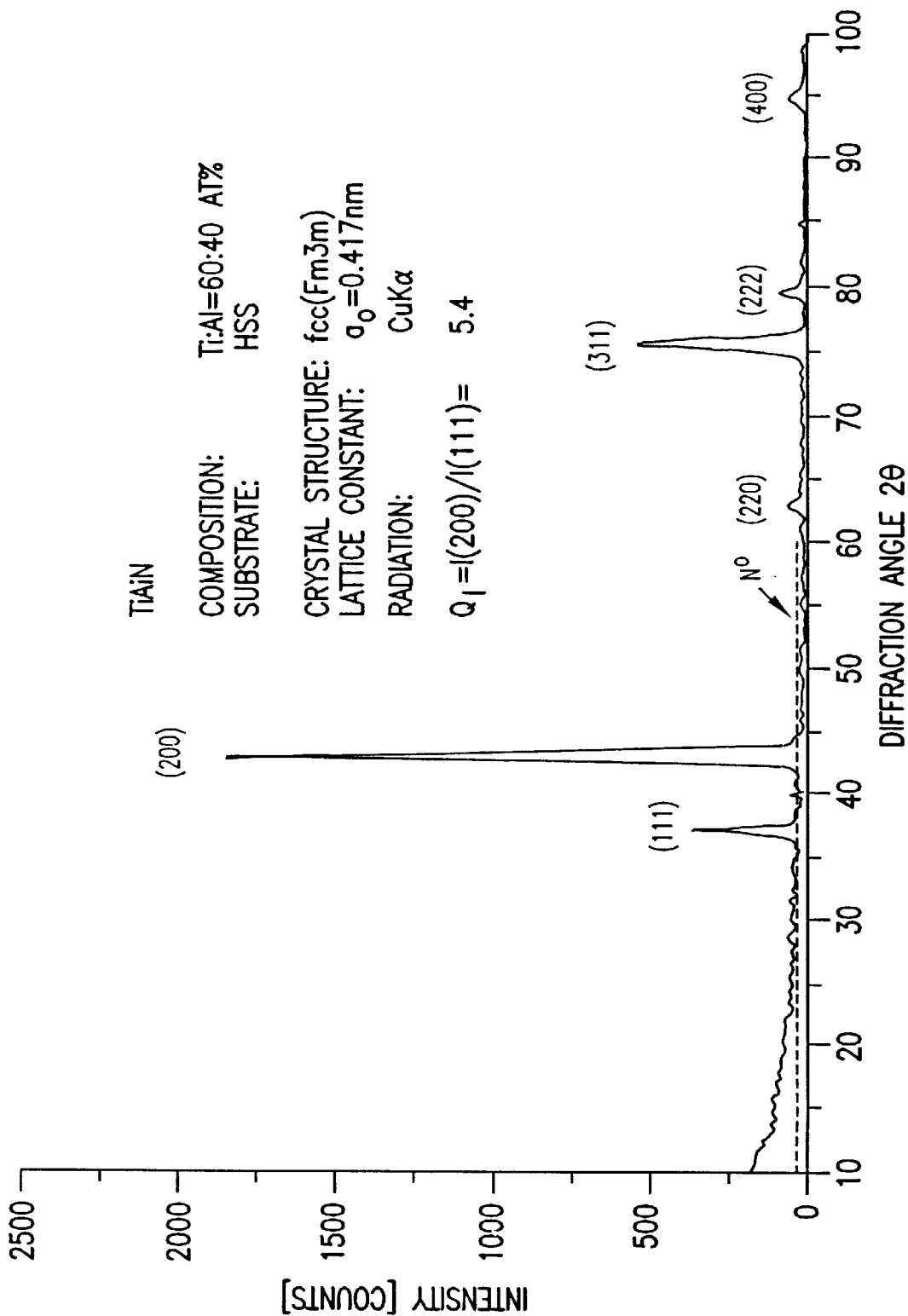
FIG. 2 is a diagram showing the relationship between typical intensity and diffraction angle <θ where the titanium aluminum nitride layer is deposited in the $Q_I \geq 1$ Region.

In FIG. 2 a typical intensity versus angle 2θ diagram is shown for the titanium aluminum nitride hard material layer deposited in the $Q_I \geq 1$ region according to the present invention of FIG. 1, resulting in a $Q_I$ value of 5.4 The average noise level N* is much less than I(200)/20. Measurement is done according to MS.

Figure 3:
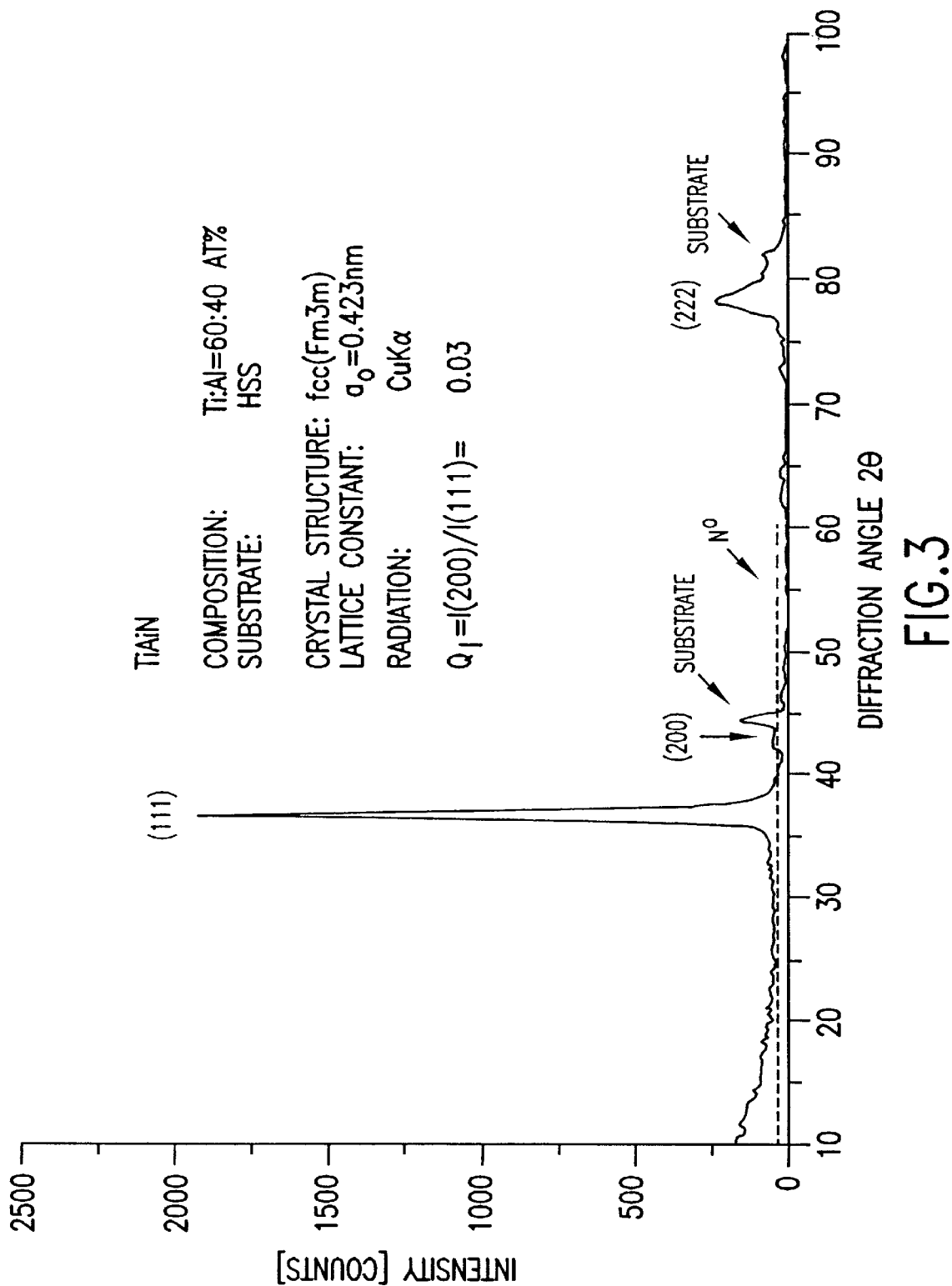
FIG. 3 is a diagram similar to FIG. 2 but with the layer deposited on a $Q_I \leq 1$ region.

In FIG. 3 a diagram in analogy of that in FIG. 2 is shown, but the titanium aluminum nitride deposition being controlled by bias voltage and nitrogen partial pressure to result in a $Q_I \geq 1$. The resulting $Q_I$ value is 0.03. Here the I(111) value is larger than the average noise level of intensity, measured according to MS.

Please note that in FIG. 1 the respective $Q_I$ values in the respective regions are noted at each working point measured (according to MS).

Figure 4:
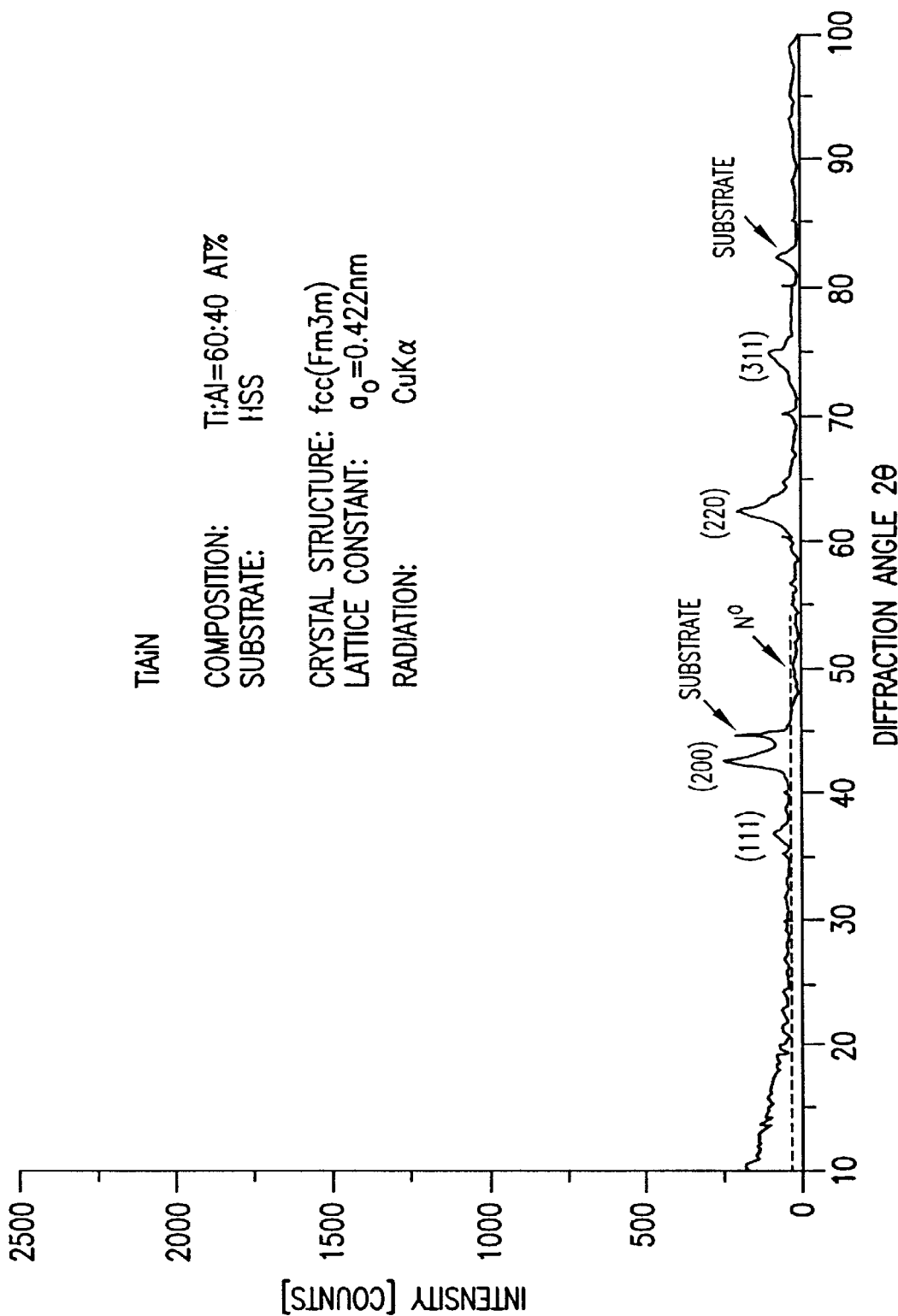
FIG. 4 is a diagram similar to FIGS. 2 and 3 for the working point $P_1$ in FIG. 1.

In FIG. 4 a diagram in analogy to that of the FIGS. 2 and 3 is shown for working point $P_1$ of FIG. 1. It may be seen that the intensities I(200) and I(111) are significantly reduced compared with those in the area outside P. None of the values I(200) and I(111) reaches the value of 20 times the noise average level N*.

Thus, by simply adjusting at least one of the two $Q_I$-controlling reactive PVD process parameters, namely of reactive gas partial pressure and of workpiece bias voltage, the inventively exploited $Q_I$ value is controlled.

In FIG. 1 there is generically shown with $\delta Q_I < 0$ the adjusting direction for lowering $Q_I$, and it is obvious that in opposite direction of adjusting the two controlling process parameters, and increase of $Q_I$ is reached.

What is claimed is:

1. A method for producing a tool comprising a tool body and a wear-resistant layer system having at least one hard material layer, comprising the steps of
   (a) reactive PVD depositing said at least one hard material layer on said tool body in a vacuum chamber,
   (b) adjusting a partial pressure of a reactive gas for said reactive PVD depositing, either alone or in combination with also adjusting a bias voltage of the tool body with respect to a predetermined reference potential, for said reactive PVD depositing so as to obtain a desired $Q_I$ value for said at least one hard material layer, said adjusting being performing based upon an interdependency of said bias voltage and of said partial pressure with respect to control of $Q_I$ value of said at least one hard material layer as follows:
   (i) an increase of said bias voltage leads to a reduction of said $Q_I$ value and a decrease of said bias voltage leads to an increase of said $Q_I$ value and,
   (ii) a reduction of said partial pressure leads to a reduction of said $Q_I$ value and an increase of said partial pressure leads to an increase of said $Q_I$ value.

2. The method of claim 1, where the step (b) comprises reducing said partial pressure for reducing said $Q_I$ value.

3. The method of claim 1, wherein the step (b) comprises increasing said bias voltage for reducing said $Q_I$ value.

4. The method of claim 1, where the step (b) comprises reducing said pressure and increasing said bias voltage for reducing said $Q_I$ value.

5. The method of claim 1, further comprising the step of performing said reactive PVD deposition by reactive cathodic arc evaporation.

6. The method of claim 5, further comprising the step of magnetically controlling said arc evaporation.

7. The method of claim 1, wherein the at least one hard material layer comprises an MeX layer, wherein Me comprises titanium and aluminum and X is at least one of nitrogen and carbon and is introduced into said PVD depositing by reactive gas.

8. The method of claim 7, said desired $Q_I$ value is $\geq 2$.

9. The method of claim 8 wherein said desired $Q_I$ value is $\geq 10$.

10. The method of claim 7, wherein said desired $Q_I$ value is $\geq 5$.

11. The method of claim 1, wherein said tool body is of one of the materials high speed steel (HSS)

cemented carbide and wherein said tool is not a solid carbide end mill and not a solid carbide ball nose mill and said desired $Q_f$ value is $\geq 1$.

* * * * *